US009406822B2

(12) United States Patent
Bamber et al.

(10) Patent No.: US 9,406,822 B2
(45) Date of Patent: Aug. 2, 2016

(54) POLISHING COATED SUBSTRATES

(75) Inventors: David Lawrence Bamber, Preston (GB); Paul David Warren, Ormskirk (GB); Troy Darrell Manning, Ormskirk (GB); Neil McSporran, Perrysburg, OH (US); Paul Arthur Holmes, Northwich (GB)

(73) Assignee: Pilkington Group Limited, Lathom (GB)

( * ) Notice: Subject to any disclaimer, the term of this patent is extended or adjusted under 35 U.S.C. 154(b) by 0 days.

(21) Appl. No.: 13/261,646

(22) PCT Filed: Oct. 27, 2011

(86) PCT No.: PCT/GB2011/052087
§ 371 (c)(1),
(2), (4) Date: May 24, 2013

(87) PCT Pub. No.: WO2012/056240
PCT Pub. Date: May 3, 2012

(65) Prior Publication Data
US 2013/0244359 A1    Sep. 19, 2013

(30) Foreign Application Priority Data
Oct. 27, 2010   (GB) .................................. 1018141.0

(51) Int. Cl.
*H01L 21/00* (2006.01)
*H01L 31/0236* (2006.01)
(Continued)

(52) U.S. Cl.
CPC .... *H01L 31/02366* (2013.01); *H01L 21/02068* (2013.01); *H01L 31/0392* (2013.01);
(Continued)

(58) Field of Classification Search
CPC ............... H01L 21/02068; H01L 31/02366; H01L 31/0392; H01L 31/03923; H01L 31/1884; H01L 51/0021; H01L 51/0096; H01L 51/442
USPC .................................................. 438/690–693
See application file for complete search history.

(56) References Cited

U.S. PATENT DOCUMENTS 3,522,342 A    7/1970    Nungesser et al.
4,507,361 A    3/1985    Twilley et al.
(Continued)

FOREIGN PATENT DOCUMENTS

EP    0 155 125 A2    9/1985
EP    0 708 480 A1    4/1996
(Continued)

OTHER PUBLICATIONS

Erkki Seppalainen; Photovoltaic coatings made possible by aerosol coating; Solar Production Worldwide; Glass Worldwide; Issue 30, Summer 2010; UK.
(Continued)

*Primary Examiner* — Richard Booth
(74) *Attorney, Agent, or Firm* — Marshall & Melhorn, LLC

(57) ABSTRACT

A process for the production of an optoelectronic device, such as a photovoltaic cell or a light emitting diode is disclosed. The process comprises providing a substrate having a conductive coating on at least one surface, the conductive coating having an initial roughness and at least one or more spikes, and applying a functional component to the coated surface of the substrate. The surface of the substrate having the conductive coating has been subjected to a polishing step using at least one brush to reduce the height of the spikes inherent to the conductive coating and to give the conductive coating a final roughness. By reducing the spikes there is less potential for the optoelectronic device to suffer from electrical shunts which reduce the efficiency of the device.

35 Claims, 11 Drawing Sheets

(51) Int. Cl.
*H01L 31/0392* (2006.01)
*H01L 31/18* (2006.01)
*H01L 51/00* (2006.01)
*H01L 51/44* (2006.01)
*H01L 21/02* (2006.01)
*H01L 33/22* (2010.01)

(52) U.S. Cl.
CPC ...... *H01L31/03923* (2013.01); *H01L 31/1884* (2013.01); *H01L 33/22* (2013.01); *H01L 51/0021* (2013.01); *H01L 51/0096* (2013.01); *H01L 51/442* (2013.01); *Y02E 10/541* (2013.01); *Y02E 10/549* (2013.01); *Y02P 70/521* (2015.11)

(56) References Cited

U.S. PATENT DOCUMENTS

| | | | |
|---|---|---|---|
| 5,226,929 | A | 7/1993 | Morii et al. |
| 5,483,568 | A * | 1/1996 | Yano et al. ............ 438/16 |
| 5,626,681 | A | 5/1997 | Nakano et al. |
| 6,225,640 | B1 | 5/2001 | Glenn et al. |
| 6,271,149 | B1 | 8/2001 | Kondo et al. |
| 6,465,567 | B1 | 10/2002 | Grobe et al. |
| 7,824,947 | B2 | 11/2010 | Pinarbasi et al. |
| 7,863,074 | B2 | 1/2011 | Wieting |
| 8,017,861 | B2 | 9/2011 | Basol |
| 8,225,496 | B2 | 7/2012 | Bachrach et al. |
| 8,435,822 | B2 | 5/2013 | Wieting |
| 2003/0062830 | A1* | 4/2003 | Guenther ......... G06K 19/07703 313/512 |
| 2007/0190789 | A1 | 8/2007 | Carter et al. |
| 2008/0280541 | A1 | 11/2008 | Chou et al. |
| 2009/0077804 | A1 | 3/2009 | Bachrach et al. |
| 2009/0078313 | A1 | 3/2009 | Basol |
| 2010/0047954 | A1 | 2/2010 | Su et al. |
| 2010/0258173 | A1 | 10/2010 | Laia et al. |

FOREIGN PATENT DOCUMENTS

| | | |
|---|---|---|
| EP | 1 054 045 A1 | 11/2000 |
| EP | 1054457 A2 | 11/2000 |
| WO | WO 2007/095322 A1 | 8/2007 |
| WO | WO 2009/029901 A1 | 3/2009 |
| WO | WO 2010/039879 A1 | 4/2010 |
| WO | WO 2010/120669 A2 | 10/2010 |

OTHER PUBLICATIONS

Woo-Sun Lee et al; CMP properties and fabrication of OLED using MEH-PPV; Physica Status Solidi (c); vol. 5, No. 10; Jul. 22, 2008; pp. 3401-3404; XP55042435.

* cited by examiner

POLISHING COATED SUBSTRATES

BACKGROUND OF THE INVENTION

The present invention relates to a process for the production of an optoelectronic device, in particular a photovoltaic (PV) module or a light emitting diode (LED) device.

A popular substrate for the manufacture of optoelectronic devices (for example photovoltaic modules or light emitting diode devices) is glass coated with a conductive coating. Various conductive coatings are known, including those based on conductive metal oxides. Of these, important conductive metal oxides include indium tin oxide and tin oxide doped with e.g. fluorine.

However, one of the problems which has been identified in the use of various coated substrates in optoelectronic devices is that occasionally spikes of conductive material occur on the surface of the coated substrate. These spikes can result in short circuits in the completed optoelectronic device and hence reduce overall efficiency.

In PV devices, it is important the maximum amount of incident light enters into the cell in order to improve the efficiency of the cell (especially true at low angles of incidence), and one method of increasing the amount of light which can enter into photovoltaic cells is by ensuring that the light scattering (haze) of light, in particular light at longer wavelengths, is relatively high by using a relatively rough conductive coating.

However, with relatively rough surfaces, there is an increased likelihood of spikes (which can cause shunts) on the surface which result in the danger of short circuiting of the optoelectronic device.

There have been solutions proposed to this problem.

For example in Glass World Wide (30) 2010, pages 75 to 77, it is proposed to adjust the deposition method for deposition of conductive metal oxides in order to partially address the shunt problem.

In U.S. Pat. No. 6,225,640 a method of detecting and removing a shunt from a photoelectric semi-conductive device is disclosed using techniques including a dental probe, a laser or high speed grinder.

WO-2007/095322 discloses a chemical-mechanical polishing (CMP) composition and method for polishing an indium tin oxide (ITO) surface. The technique disclosed significantly smoothes the surface (changing the $R_a$) which is not advantageous in certain products (for example PV cells of certain sorts). The polishing technique disclosed in WO-2007/095322 is again relatively vigorous.

In Phys. Stat. Sol. (5) (2008) pages 3401 to 3404 (Lee, Woo-Sung) a CMP fabrication process is disclosed for organic light emitting diodes. The ITO coatings are deposited by RF magnetron sputtering. The CMP process is relatively vigorous using a relatively high polisher pressure and pad polishers.

SUMMARY OF THE INVENTION

The use of brushes to wash the surface of glass is well known. In EP1054457B1 there is disclosed a method and apparatus for manufacturing a semiconductor device made by forming a thin film on a substrate, such as a thin-film photovoltaic module. It is further disclosed that when a thin film is formed on a substrate, particles may be attached to the substrate. If this happens, defects will develop. Therefore the substrate is usually washed before the thin film is formed on the substrate to remove the particles. A washing station comprising upper and lower brushes is used to wash a glass substrate having a transparent conducting film formed thereon.

In WO2010/039879A1 the use of a laser to ablate regions of a coating on a surface of a glass substrate is described. Imperfections during the laser ablation process may leave a certain amount of residue/deposit or an un-removed portion of the thin film material forming one or more berm structures inside or around the laser ablation pattern. A mechanical brush is used to remove the debris or particles inside the pattern. The length of the brush bristles can be chosen to be sufficient to reach debris (caused by laser ablation) inside the scribed region in addition to removing the berm structures on the surface region.

US2010/0047954A1 describes a general solar cell formation process sequence. The solar cell comprises a substrate having a transparent conducting oxide (TCO) layer thereon. Such a sequence includes a substrate cleaning step to remove any contaminants found on the surface of the substrate. In a wash section the substrate is wet cleaned with a brush and hot water. Contamination, in particular particles, on the TCO surface and/or on the bare glass surface can interfere with subsequent laser scribing steps. If the laser beam runs across a particle, it may be unable to scribe a continuous line and a short circuit between cells will result. In addition, any particulate debris present in the scribed pattern and/or on the TCO of the cells after laser scribing can cause shunting and non-uniformities between layers.

There is a need to address the problem of electrical shunts/shorts in optoelectronic devices which is generally applicable and relatively straightforward to put into practice in an industrial process.

The present invention aims to address this need and to overcome the problems associated with the prior art.

The present invention accordingly provides in a first aspect a process for the production of an optoelectronic device, the process comprising, (a) providing a substrate having a conductive coating on at least one surface of the substrate, the conductive coating having an initial roughness and at least one or more spikes, and (b) applying a functional component to the coated surface of the substrate, characterised in that the surface of the substrate having the conductive coating has been subjected before step (b) to a polishing step using at least one brush to reduce the height of the spikes inherent to the conductive coating and to give the conductive coating a final roughness.

With reference to FIG. 7 (not to scale), when the conductive coating 1 is formed on the substrate 3, for example by chemical vapour deposition, at the sub micron level the coating that is deposited on a surface of the substrate is not smooth. At some positions on the coating a spike of coating material 5 is present which extends above the mean roughness (shown as dashed line 7) of the coating. The mean roughness and the height of the spikes relative thereto depends upon the type of coating deposited.

By reducing the height of the spikes of coating material, the possibility of shunting is reduced. If the height 6 of the spike of coating material relative to the mean roughness of the coating is greater than the thickness of a first subsequently deposited coating layer 9 on the conductive coating 1, the spike 5 will extend beyond the first subsequently deposited coating layer 9 and may give rise to a short circuit between the conductive coating and a second subsequently deposited coating layer 11 deposited on the first subsequently deposited coating layer 9. If the first subsequently deposited coating layer 9 has a thickness greater than the spikes 5, the potential for shunts or short circuits is essentially eliminated.

For certain first subsequently deposited coating layers, relative to the mean roughness of the conductive coating, a spike may have a height greater than 10 nm, preferably greater than 20 nm, more preferably between 10 and 500 nm, even more preferably between 10 and 100 nm.

The construction of optoelectronic devices such as photovoltaic cells is well known in the art. For example a known photovoltaic cell comprises a TCO coating on a substrate, usually glass. The photovoltaic material is deposited onto the TCO in the form of functional layers. Typically a thin (10-80 nm) first semiconducting layer is first deposited directly onto the TCO. Next a much thicker (often a few microns thick) second semiconductor layer is deposited onto the first semiconducting layer. The first semiconducting layer may be n-type material, and the second semiconducting layer may be p-type material.

If the TCO coating has spikes of coating material thereon inherent to the coating, when the first semiconducting layer is deposited onto the TCO coating, the spikes may not be covered such that the spike is able to extend into the second semiconducting layer. This results in a shunt, reducing the efficiency of the photovoltaic cell. The size of the spike depends upon the type of TCO coating on the substrate surface. For example, for ITO the spikes are typically at least an order of magnitude greater in height than the local roughness of the coating surface. In contrast for fluorine doped tin oxide (FTO), the spike is typically less than 10 times the height of the local roughness, for example about 3-5 times higher.

The spikes are not visible to the naked eye and may be observed using an Atomic Force Microscope (AFM).

The great and surprising advantage of using a brush is that, in practice, the bristles of the brush appear to remove or reduce the spikes (which are the main cause of short circuits and consequent loss of efficiency) without significantly affecting the rest of the surface. Because the brush polishing technique is relatively low pressure (as opposed to, for example use of a pad where relatively high pressure may be exerted on the surface of the coated substrate) the brush polishing technique has little effect on the underlying properties of the coated substrate. This is beneficial in a number of optoelectronic devices (e.g. PV devices) because adjustment of other stages of the process (for example deposition stages) would not be necessary in order to compensate for the effects of a new brush polishing step. Thus it is preferred if the process is such as to remove many or most of the spikes on the surface (e.g. significantly reducing certain roughness parameters e.g. Sz preferably by 10, 20, 30 or 40% or more compared to the value of the substrate before polishing) while preferably not reducing so significantly the general roughness of the coating; albeit with some change in more general roughness parameters.

Preferably the initial roughness and the final roughness are substantially the same. Preferably the final roughness is less than the initial roughness by between 5% and 40%. Preferably the final roughness is 5% less than the initial roughness. Preferably the final roughness is 10% lower than the initial roughness. Preferably the final roughness is 20% lower than the initial roughness. Preferably the final roughness is 30% lower than the initial roughness. Preferably the final roughness is 40% lower than the initial roughness.

The actual value of the initial roughness depends upon the type of conductive coating.

The optoelectronic device may be a PV cell (for example a solar cell). In this case the functional component will be a component of a PV device.

Alternatively, the optoelectronic device may be a light emitting diode device, in particular an organic light emitting diode device (OLED). In this case; the functional component comprises a material for use in light emitting diodes.

Preferably, the polishing step uses a liquid polishing medium, preferably an aqueous polishing medium (i.e. a medium comprising water). Surprisingly, it has been discovered that good properties and significant reduction in the number of spikes on the coated surface may be achieved even without the use of an abrasive (i.e. just using an aqueous solution with no abrasive particles present). Thus, in the preferred embodiment, the polishing step comprises a liquid polishing step with no additional abrasive components. However, alternatively, and if desired (for example in certain products for example OLED products), an abrasive may be added to the liquid polishing medium. Preferred abrasives include metal oxide abrasives for example alumina, silica, ceria or zirconia. Preferably, the polishing step will use a rotary brush. It is preferred if the rotary brush during polishing has an axis of rotation transverse to the surface of the glass substrate. Preferably the rotary brush has a rotational speed of less than 1000 rpm relative to the substrate, preferably between 50 and 500 rpm relative to the substrate, more preferably between 100 and 300 rpm relative to the substrate.

The duration of the polishing step depends on the size of the brushes, the number of bristles per unit on the brush and the speed of the brush relative to the substrate. For example, similar results may be obtained using a brush at a rotational speed $S_1$ relative to the substrate surface for a duration $T_1$ and a brush at a rotational speed of $\frac{1}{2}S_1$ for a duration of $2\,T_1$.

It is advantageous if the bristles of the brush comprise a synthetic material, preferably nylon (e.g. nylon 612 or nylon 66) or polyester. However, other types of bristles may also be useful in the process.

It will be readily apparent that the nature of the bristle can be changed such that each bristle incorporates an amount of abrasive. Examples of such bristles are disclosed in U.S. Pat. No. 4,507,361 and U.S. Pat. No. 5,226,929. Methods for making bristles having an abrasive filler are known, for example being described in U.S. Pat. No. 3,522,342. If the bristle contains an abrasive, it may not be necessary to use a separate abrasive added to a lubricant during the polishing step.

The bristles should be chosen to remove the spikes without creating any major surface scratches that may reduce the suitability of the coated glass for incorporation into an optoelectronic device. The suitability of a particular bristle type may be determined by routine experiment. For example, the effectiveness of a particular brush may be determined by determining the effect on the coating roughness as a function of polishing time, brush rotation, slurry composition etc. After each experiment, the coating roughness can be characterised using an atomic force microscope.

Preferably the bristles of the brush will have a diameter in the range 0.1 to 1 mm, preferably 0.2 to 0.8 mm and more preferably 0.2 to 0.6 mm. Preferably, the length of the bristles of the brush will be in the range 5 to 50 mm, more preferably 10 to 45 mm and most preferably 20 to 40 mm.

In the process according to the first aspect of the invention, the conductive coating on the glass substrate preferably comprises a conductive oxide, preferably a conductive metal oxide.

Preferred conductive metal oxides include zinc oxide (preferably doped), indium tin oxide (ITO) or tin oxide. The most preferred conductive metal oxide comprises tin oxide, preferably doped tin oxide, more preferably fluorine doped tin oxide.

Preferably the substrate is glass. Other substrates include plastic such as polycarbonate and polyethylene terephthalate (PET).

Preferably the substrate has a thickness between 1 mm and 25 mm.

It is preferred if the conductive coating on the glass substrate is deposited by a chemical vapour deposition (CVD) step. Usually the CVD step is carried out at atmospheric pressure. Alternatively, the conductive coating may be deposited by other techniques including sputter or other vacuum deposition techniques.

The result of the polishing process is a significant reduction in the number of spikes on the surface of the conductive coating with a consequent reduction in the chance of electrical shorts being developed in the optoelectronic device. Generally, it is preferred if the polishing method is conducted such that the number of spikes per unit area after polishing is significantly reduced.

DETAILED DESCRIPTION OF THE INVENTION

The embodiments of the invention will now be described with reference to the accompanying drawings in which.

EXAMPLES AND COMPARATIVE EXAMPLES

Figure 1:
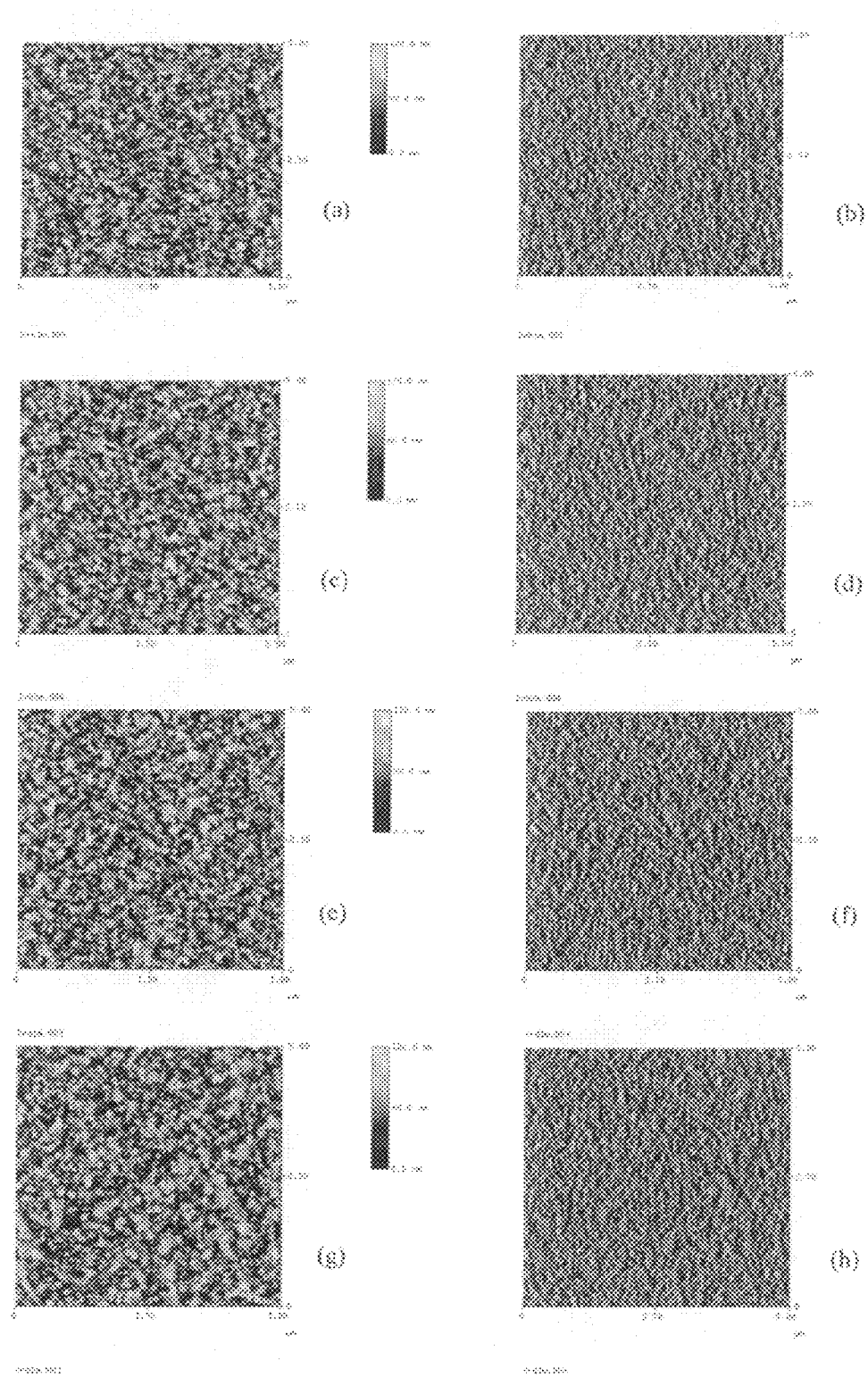
FIG. 1 shows Atomic Force Microscope (AFM) images of the coated glass surface before being polished.

The invention is further illustrated by the following examples in which coatings were deposited on to the surface of glass substrates by online chemical deposition during the float glass production process. The coating comprised a sodium ion blocking layer (including layers of silicon oxide and tin oxide) and a conductive layer of fluorine doped tin oxide. The glass substrates are sold by the applicant company under the trade name TEC™ C15.

Substrates in all cases were 4 mm thick float glass. For photovoltaic applications, the level of light absorbing impurities (such as iron oxide) in the float glass may be reduced to minimise the light absorbed by the substrate. Different substrate thicknesses may be used where appropriate, for example 1-10 mm.

The examples were polished with two types of brush: a first brush with stiff bristles without using any polishing agent or slurry using water as a lubricant during the polishing process; a second soft brush with a polishing medium comprising slurry of a 10% dilution of Acepol AL (a grade of white calcined alumina)

The brushes have a circular polishing head perpendicular to the axis of rotation. They were fixed in a pillar drill. A fixed rotation speed during polishing of 258 rpm was used.

Further details of the polishing process are given below.

During polishing the brush was lowered until contact was just made with the coated substrate, such that the tips of the brush bristles were providing the majority of the contact between brush and coating.

For the soft brush experiment the slurry applied was a 10% dilution of Acepol AL, a grade of white calcined alumina, supplied by Aachener Chemische Werke (Germany).

For the stiff brush experiment ambient temperature water was applied to the coated substrate during the brushing process.

Soft brush with slurry polishing was carried out for a total of 2 minutes.

Stiff brush (no slurry polishing) was performed for a total of 6 minutes.

Details of the brush types are as follows in Table 1:

TABLE 1

| Brush type | Diameter of each bristle | Protruding length of each bristle from the brush housing |
|---|---|---|
| Soft | 0.25 mm | 28 mm |
| Stiff | 0.50 mm | 30 mm |

After polishing the substrates for 2 minutes (soft brush with slurry) and 6 minutes (stiff brush, no slurry), samples were taken from each polished area as well as in surrounding reference (unpolished) areas.

The polishing process was surprisingly successful at removing singular high peaks whilst leaving the rest of the topography only slightly changed as shown by the AFM measurements described below.

The stiff brush with water only was a little more effective than the softer brush with the slurry.

Avoiding the use of a slurry or polishing agent offers additional benefits, for example less contamination of the surface topography (by the slurry particles), with subsequent ease of cleaning of the polished article.

Brush Bristle Analysis

The bristles from each brush were analysed using a scanning electron microscope (SEM) equipped with an energy dispersive spectroscope in an attempt to determine the bristle composition using energy dispersive spectroscopy (EDS).

A bristle from each brush (soft brush and the stiff brush) was cut into two providing a section through the bristle. The bristle was then mounted onto a SEM stub and coated in carbon to provide a conductive surface.

A number of bristles of each type were ashed down to reveal any inorganic fillers present in the nylon. This technique did not have sufficient accuracy to determine if the stiff bristles contained any inorganic filler. Using this technique the soft brush bristles were found to contain a small amount of filler which was mounted on an adhesive tab and coated in carbon.

Stiff Brush Bristle

The back-scattered electron (BSE) micrograph showed some very small bright spots (smaller than 100 nm) in the surface of the bristle. EDS analysis from an area average of the bristle cross section showed the bristle contained carbon and oxygen (nylon). EDS analysis of one of the bright spots showed that these contained magnesium, aluminium and chlorine (likely to be some form of inorganic filler). The EDS spectrum was dominated by the carbon peak from the surrounding nylon. The oxygen is at a slightly higher level than the nylon suggesting some is associated with the inorganic elements.

Soft Brush Bristle

The BSE micrograph showed some bright spots in the fine bristle (as for the stiff bristle). EDS analysis from an area average of the soft brush bristle showed the bristle contained carbon and oxygen (nylon) and a trace of titanium. The titanium is likely to be in the titania form and possibly used to give the bristle a white colour.

Soft Brush Bristle Ash Analysis

An EDS analysis of the ash of the soft brush bristles showed the bristle filler contained carbon, oxygen, aluminium, silicon, calcium, titanium and a trace of sodium, magnesium and potassium. The fillers are likely to be titania, aluminosilicates and calcium carbonate.

Brush Bristle Summary

The stiff bristles contained some very small particles (smaller than 100 nm). The analysis showed the bristle contained magnesium, oxygen, aluminium and chlorine. This suggests that alumina may be present in these bristles that may contribute to the polishing of the TCO coating.

The fine bristle contained more bright particles that appeared to be titania. Analysis of the ashed bristles provided evidence for the presence of titania, aluminosilicates and calcium carbonate.

To analyse the surface features of the coated glass, pre- and post-polishing, an Atomic Force Microscope (AFM) was used.

AFM Technique

The AFM is a technique which uses a small tip (approximately 10-20 nm in radius) to physically measure surface topography in the nm height range and nm to μm lateral range. The conventional Tapping™ mode has been used in this analysis, in which the AFM tip intermittently contacts the surface.

AFM Experimental

Polished and unpolished (reference) samples of fluorine doped tin oxide glass were analysed using an AFM. The objective was to determine how the coating structure had been altered by two polishing processes. Four sets of specimens were analysed, two of which had been subject to polishing with synthetic brushes. The samples were designated as follows:

Two minute polish with soft brushes and a 10% dilution of Acepol Al alumina

Six minute polish with stiff brushes (no alumina, just water)

An additional set of unpolished reference coating was provided for each polished sample set.

The samples have been given the following nomenclature:
Samples 1-4: 2 min soft brush polish with alumina slurry
Samples 5-8: 2 min reference (unpolished)
Samples 9-12: 6 min stiff brush polish with water only
Samples 13-16: 6 min reference (unpolished)

The AFM was employed in Tapping™ mode to image the samples provided over a region of 5×5 μm in one area of each specimen. In FIGS. 1-4 the images are shown as pairs, such that the height image is shown on the left hand side of the page and the amplitude image on the right hand side of the page—this has no units and is the error signal generated by the AFM in determining how much voltage needs to be applied to maintain the tip on the surface. It can be viewed as a change in height image (or differential of the height) and is particularly useful to highlight subtle surface features.

Surface texture (roughness) analysis of the height images, using the inbuilt Nanoscope 5 AFM software, was undertaken to determine what, parameters may be useful to describe the features observed when the samples were imaged. Additional analysis of the images to provide a height distribution of the surface structure of the images was undertaken using the freeware software, Gwyddion.

AFM Results and Discussion

The AFM images of the four specimen sets are shown in FIGS. 1-4.

Figure 2:
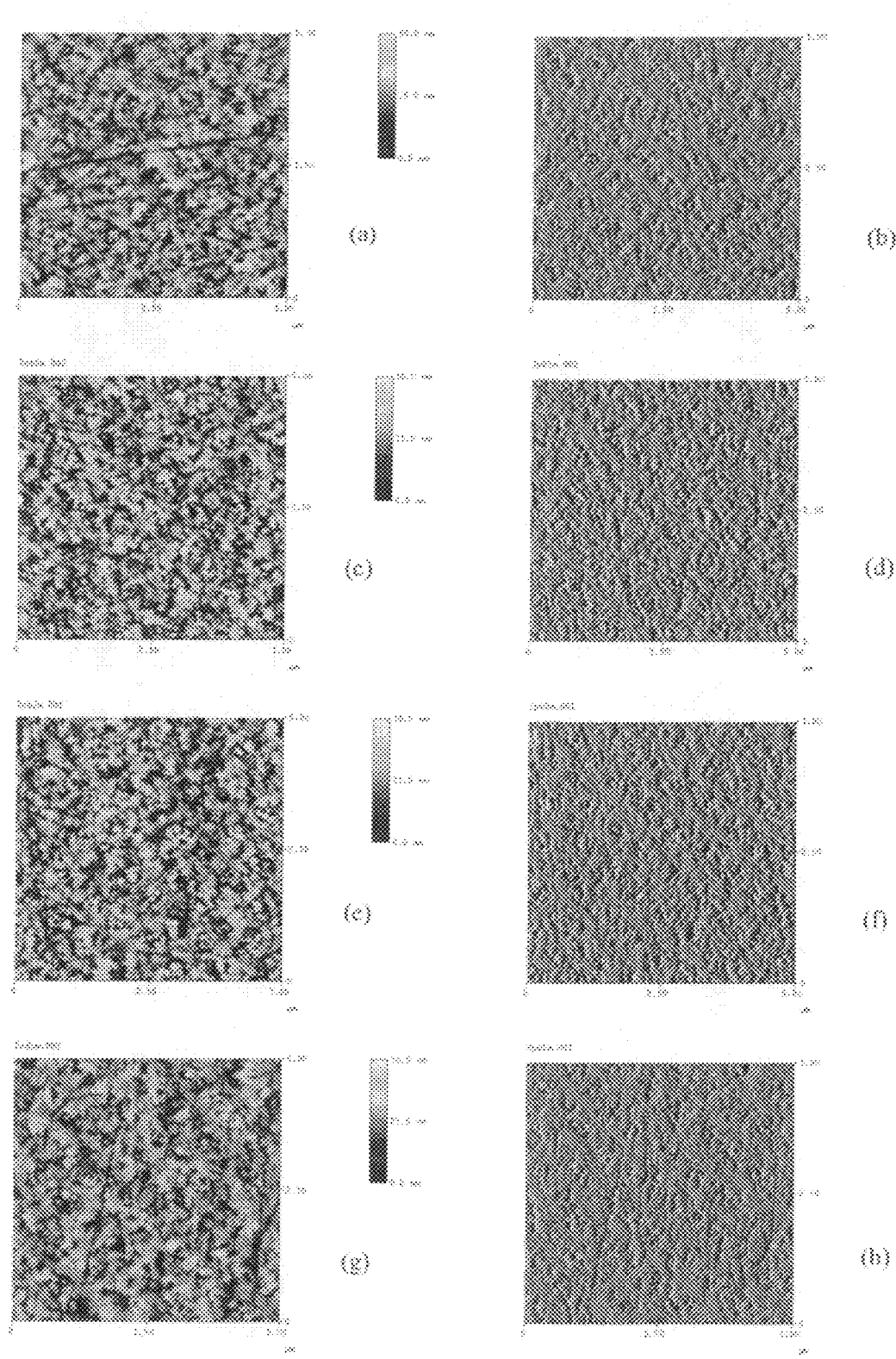
FIG. 2 shows Atomic Force Microscope (AFM) images of the coated glass surface after polishing for 2 minutes with a soft brush and an alumina slurry.

The AFM images in FIG. 1 and FIG. 2 show that the coating that has been polished with the soft brushes and alumina is smooth when compared to the reference coating. Fine lines, which are regions where the boundaries between groups of grains have been revealed by polishing can be easily observed. The polishing has removed all of the high points of the fluorine doped tin oxide substrate, leaving a relatively flat surface with pits, or valleys, remaining.

Figure 3:
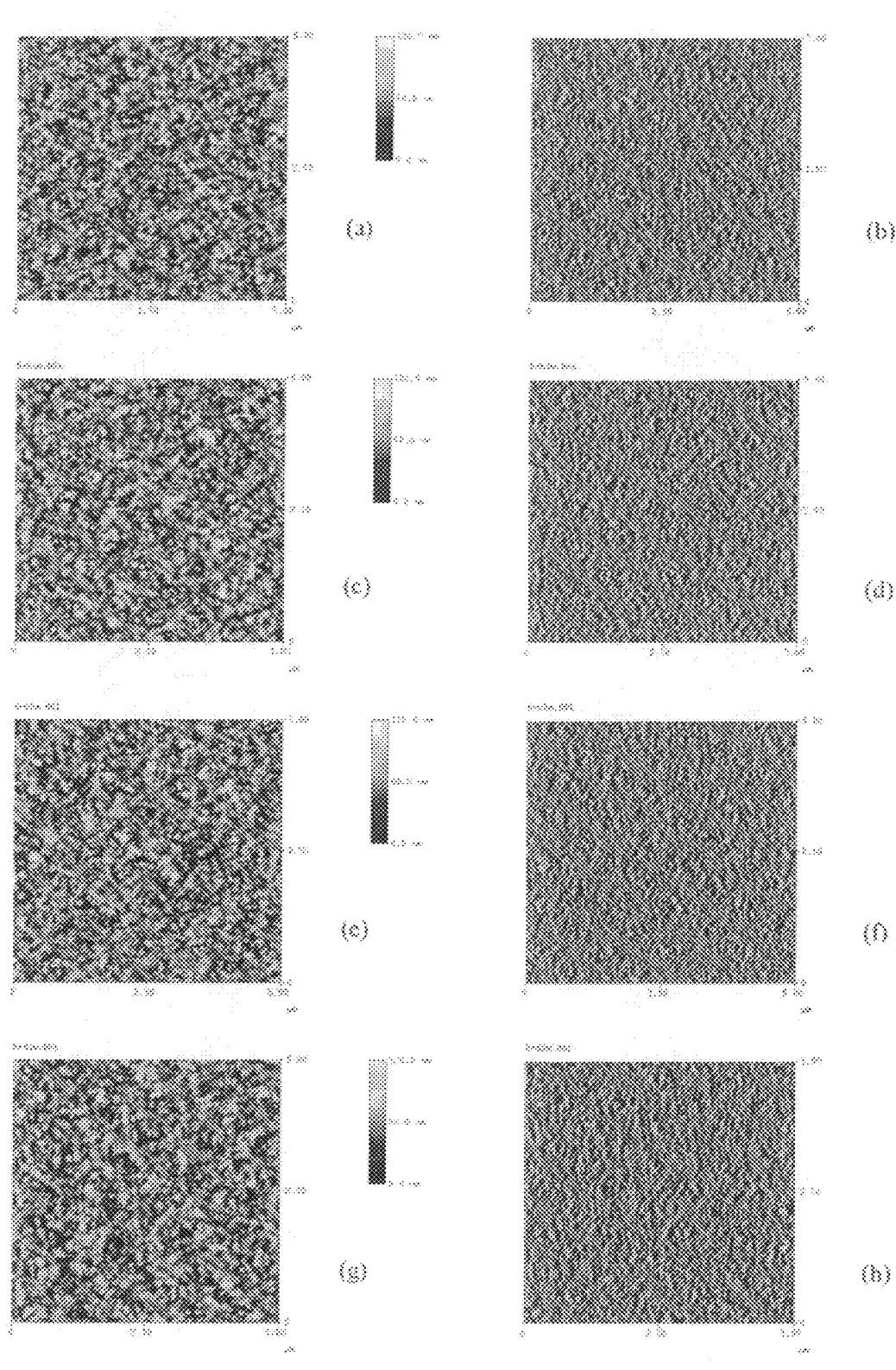
FIG. 3 shows Atomic Force Microscope (AFM) images of the coated glass surface before being polished.
Figure 4:
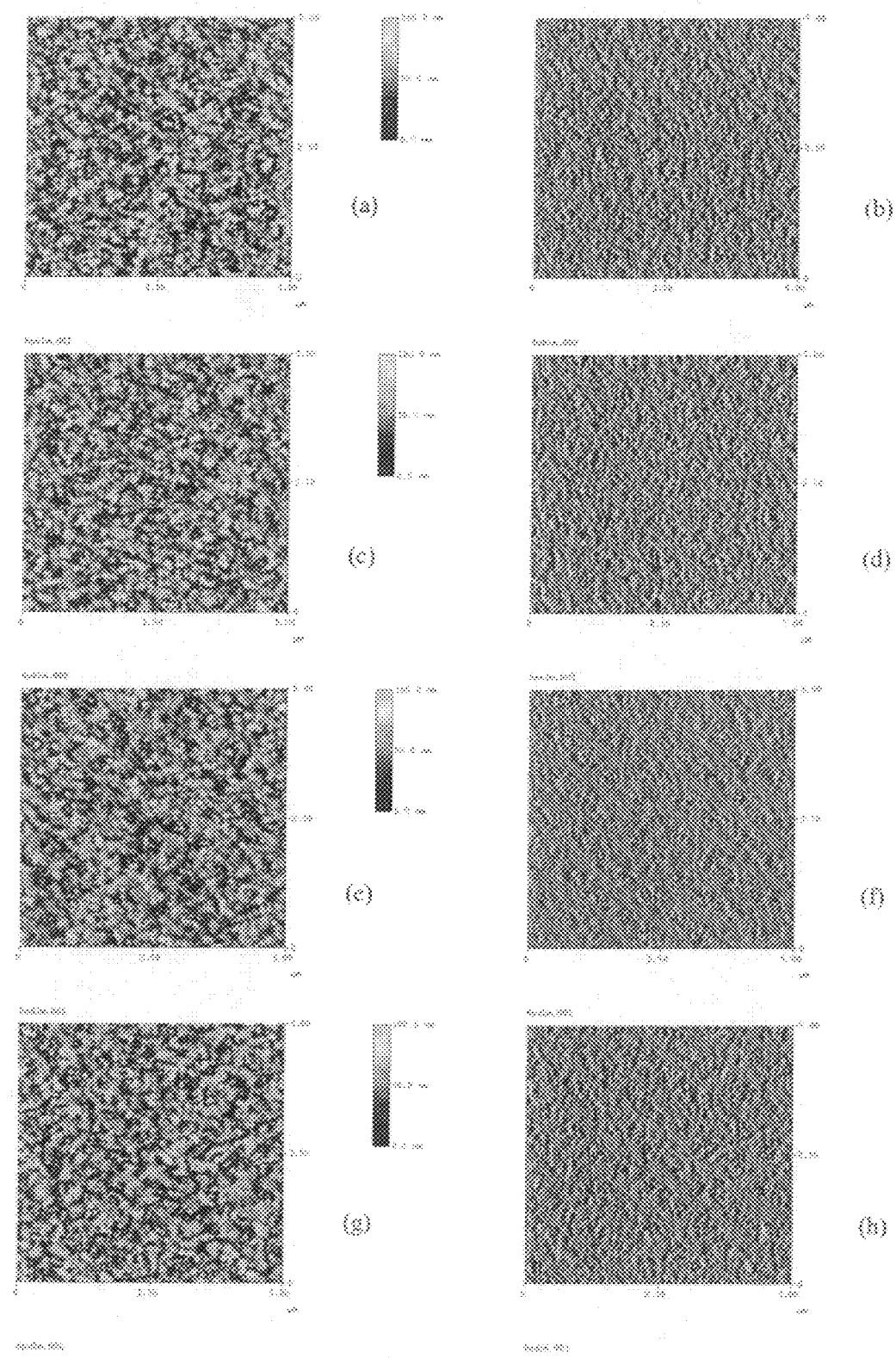
FIG. 4 shows Atomic Force Microscope (AFM) images of the coated glass surface after polishing for 6 minutes with a stiff brush and water.

The AFM images in FIG. 3 and FIG. 4 show that polishing with the stiff brush and only water has removed the high points from the coating structure, whilst leaving most of the coating unaffected. However it appears that some of the high points within the valleys have also been removed. It appears that any sharp spikes on the coating surface, whether at the very top of the coating structure, or small particulates within the valleys have been partially removed.

Figure 5:
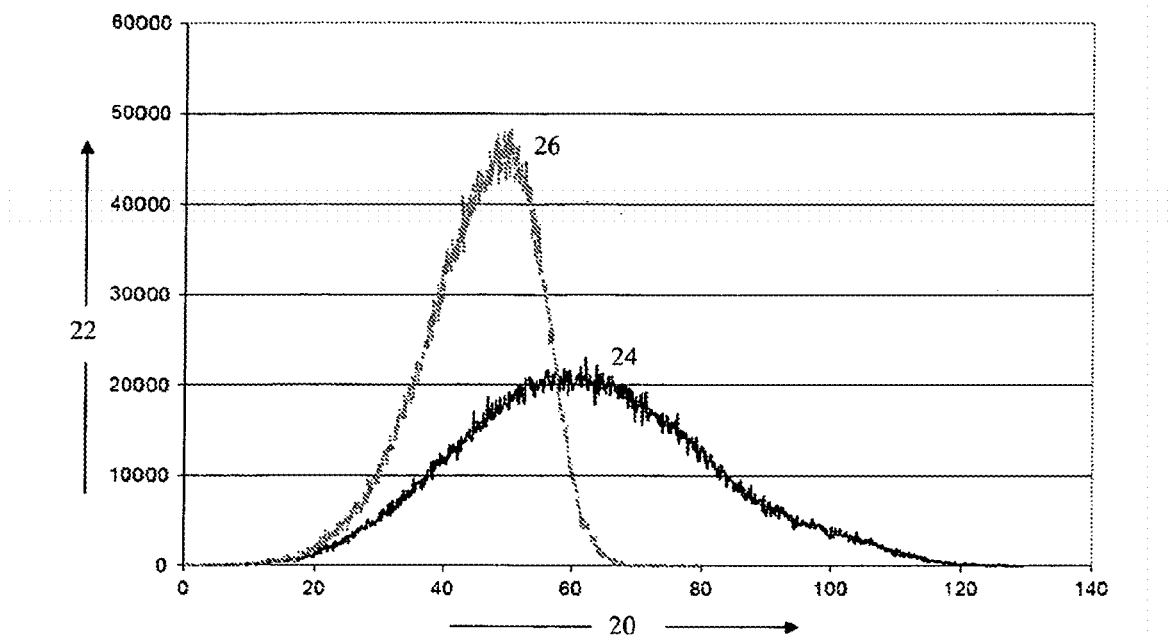
FIG. 5 and FIG. 6 illustrate the distribution of the heights of one of the AFM images of the polished surfaces for the 2 min and 6 min polished specimens respectively, compared to reference surfaces.
Figure 6:
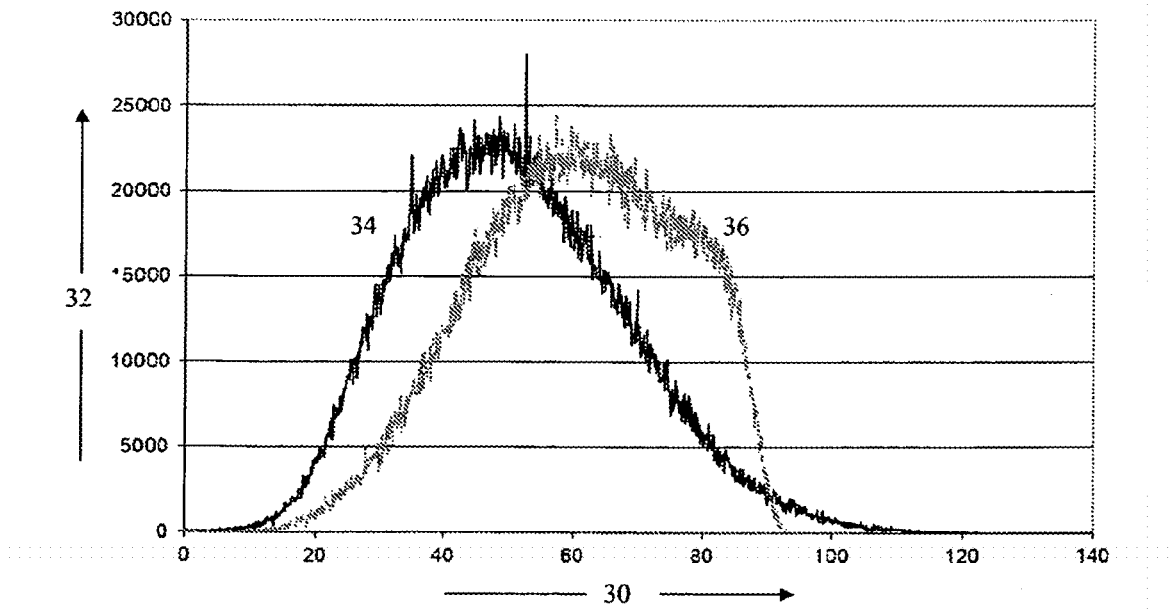
Figure 7:
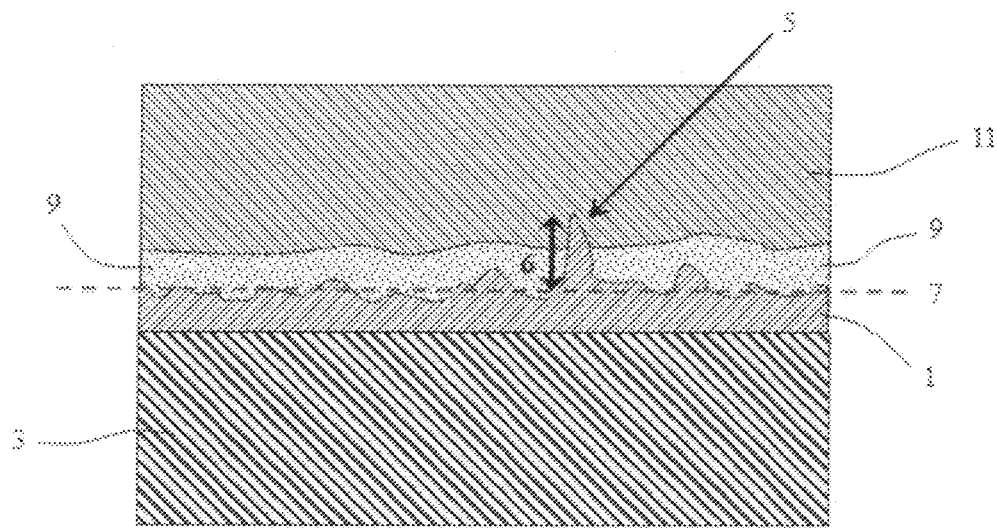
FIG. 7 (not to scale) shows a cross sectional view of part of an optoelectronic device to illustrate a shunt due to a spike.

The distribution of the heights of one of the AFM images of the polished surfaces compared to a reference surface are shown in FIG. 5 and FIG. 6, for the 2 mm and 6 min polished specimens respectively.

In FIG. 5 axis 20 is height in nm, axis 22 is distribution per mm, line 24 is for the coating before polishing, and line 26 is the distribution for the coating after being polished with the soft brush and alumina slurry for 2 minutes.

In FIG. 6 axis 30 is height in nm, axis 32 is distribution per mm, line 34 is for the coating before polishing, and line 36 is the distribution for the coating after being polished with the stiff brush and water for 6 minutes.

The distribution plots in FIG. 5 and FIG. 6 show that the heights of the reference coatings are relatively evenly distributed, but do have tails into the high grain heights, up to 140 nm. When polished these are removed by both polishing methods. However the polishing with the stiff brush appears to be more discriminating, and has removed the tall spikes, and some of the smaller spikes within the valleys, such that the overall baseline height of the 6 min polished specimens has increased.

The results of the roughness parameters (a full description of these parameters can be found in the Appendix) are shown in Table 2 and Table 3. In these tables, the units are nanometers (nm). When comparing these it can be seen that the surface roughness relating to changes in height of the coatings (Sa, Sq, Sp, Spm, Sz and St) are much reduced for the 2 min polished with alumina specimen. The parameters associated with the depth of the valleys (Sv, Svm) are also slightly reduced, or similar in the case of the average valley depth. Some reduction in these height based parameters is also observed for the 6 minute polish, but not as great. In fact the Sa is only 18% less than the reference coating. The values corresponding to the depth of the valleys are similar to the reference coating for both the maximum and average valley.

The Ssk values describe the asymmetry of the height distribution plots (FIGS. 5 and 6) with negative values approaching 1 for the two minute polished specimens indicating a valley dominated surface, compared to a value of 0.1-0.2 for the unpolished reference, indicating a slightly peaked surface.

The 6 minute polished specimen also has a negative skew, although smaller in value, indicating a surface tending towards valley dominated.

The peak counts were reduced by 50% for the 2 minute polished specimen, compared to a 20% reduction for the 6 minute polished specimen, again an indication of the more discriminating polish achieved by the coarser brush when used with water alone.

It can be seen from table 2 and table 3, that before any polishing, the as-produced coating has a roughness Sa of about 15 nm (table 2, samples 5-7 Sa has an average of 15.006 nm and table 3, samples 13-16 Sa has an average of 14.306 nm). Polishing with the soft brush and slurry for 2 minutes has reduced Sa to an average of about 6 nm, whereas polishing with the stiff brush and water for 6 minutes the Sa has only reduced to about 12 nm.

From tables 2 and 3, the as-produced coating before any polishing has a maximum peak height Sp of between 69-76 nm. Polishing with the soft brush and slurry for 2 minutes has reduced Sp to about 25 nm, whereas polishing with the stiff brush and water for 6 minutes has reduced Sp to about 37 nm.

Figure 8:
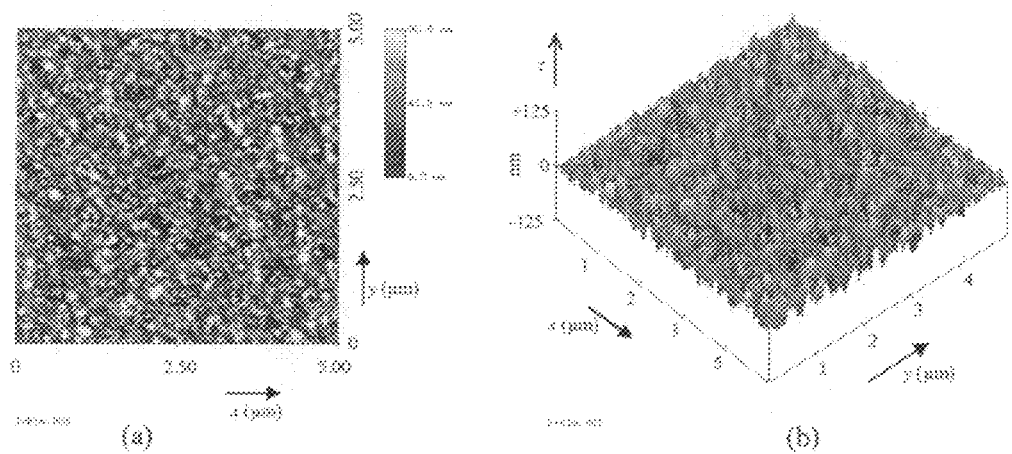
FIG. 8a shows the data from FIG. 1a resealed from 0 to 90 nm and FIG. 8b is an isometric representation of FIG. 8a scaled in the z-axis from −125 nm to +125 nm.
Figure 9:
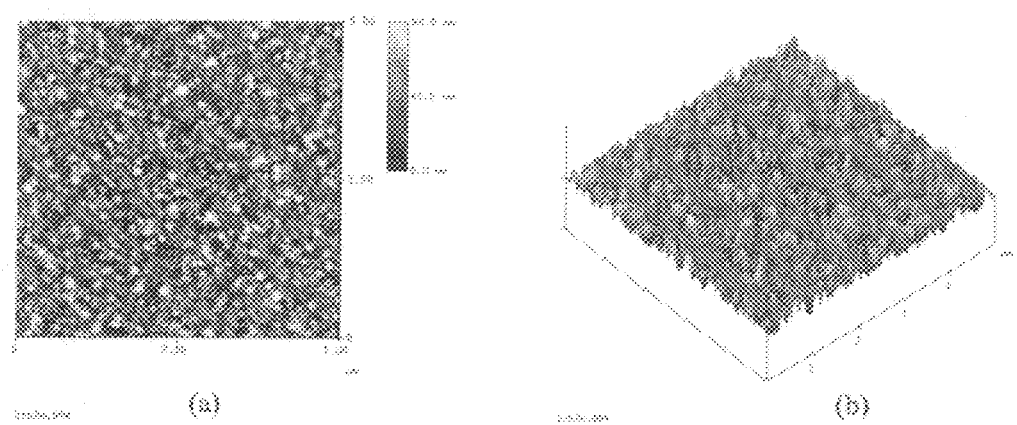
FIG. 9a shows the data from FIG. 1c resealed from 0 to 90 nm and FIG. 9b is an isometric representation of FIG. 9a scaled in the z-axis from −125 nm to +125 nm.
Figure 10:
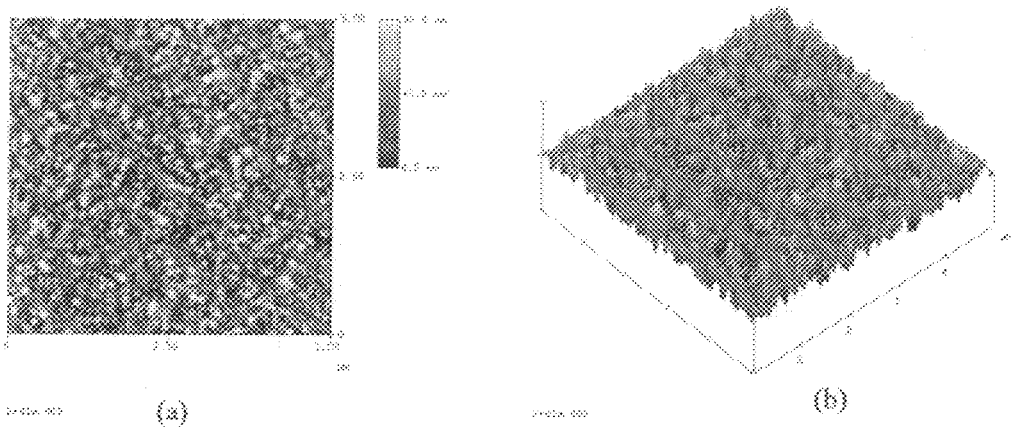
FIG. 10a shows the data from FIG. 1e resealed from 0 to 90 nm and FIG. 10b is an isometric representation of FIG. 10a scaled in the z-axis from −125 nm to +125 nm.
Figure 11:
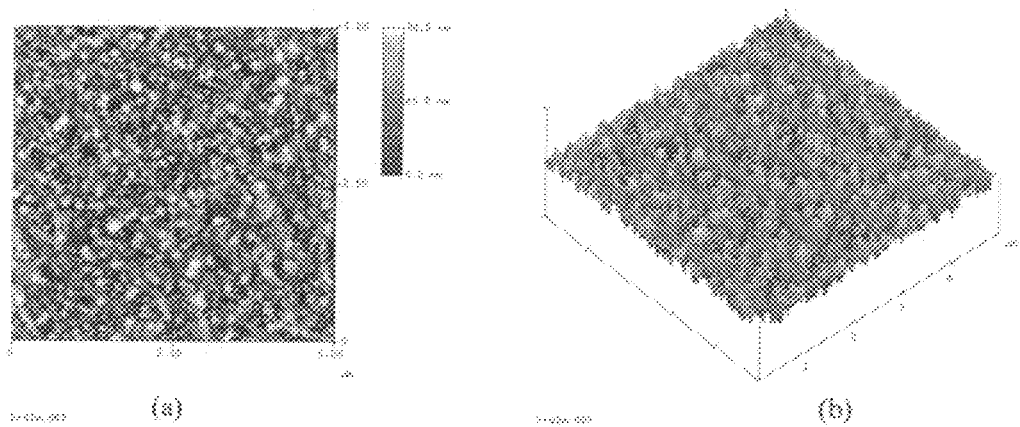
FIG. 11a shows the data from FIG. 1g rescaled from 0 to 90 nm and FIG. 11b is an isometric representation of FIG. 11a scaled in the z-axis from −125 nm to +125 nm.
Figure 12:
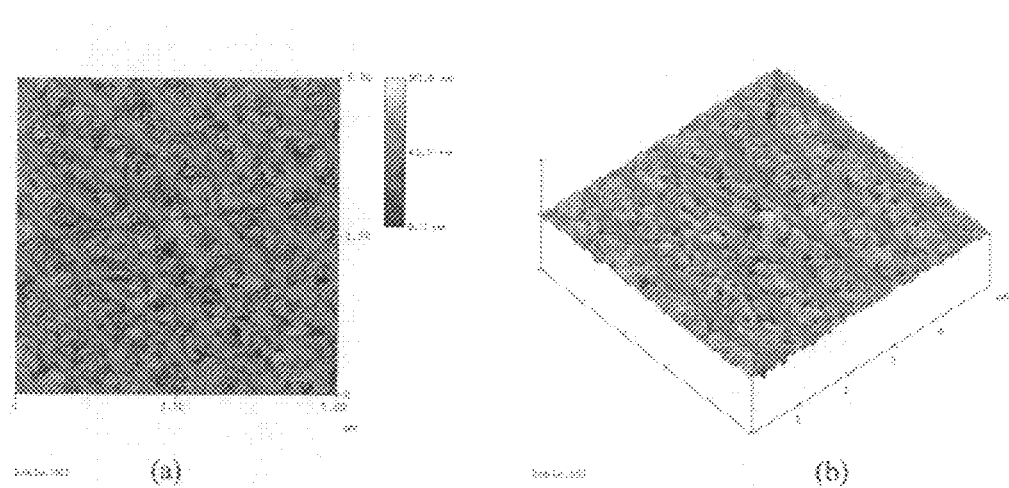
FIG. 12a shows the data from FIG. 2a rescaled from 0 to 90 nm and FIG. 12b is an isometric representation of FIG. 12a scaled in the z-axis from −125 nm to +125 nm.
Figure 13:
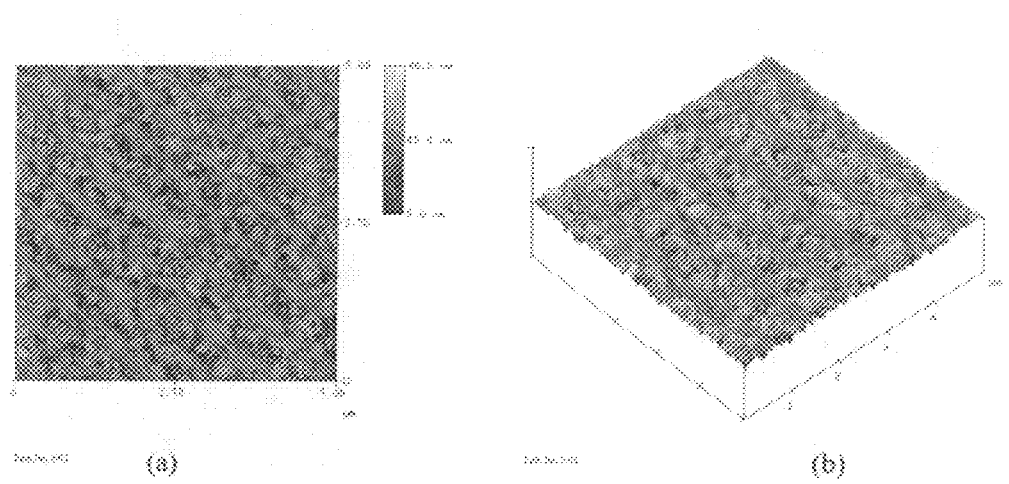
FIG. 13a shows the data from FIG. 2c rescaled from 0 to 90 nm and FIG. 13b is an isometric representation of FIG. 13a scaled in the z-axis from −125 nm to +125 nm.
Figure 14:
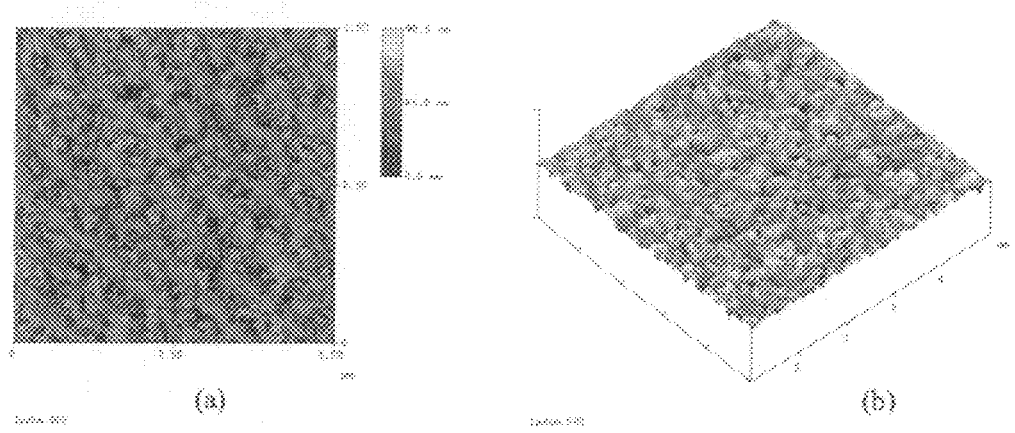
FIG. 14a shows the data from FIG. 2e rescaled from 0 to 90 nm and FIG. 14b is an isometric representation of FIG. 14a scaled in the z-axis from −125 nm to +125 nm.
Figure 15:
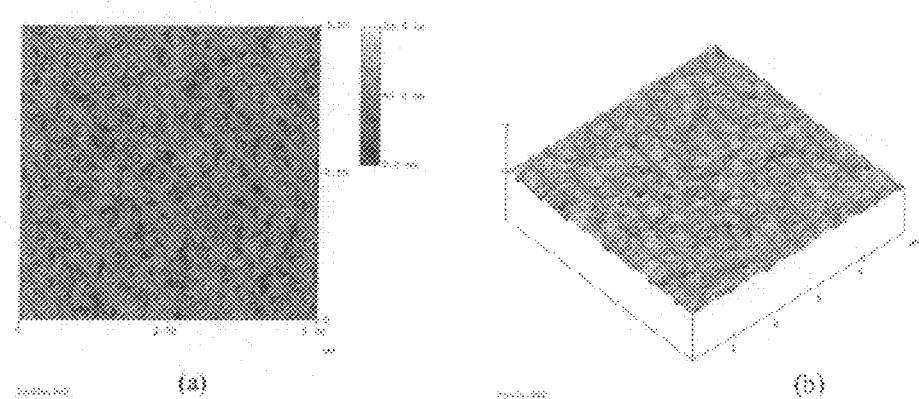
FIG. 15a shows the data from FIG. 2g resealed from 0 to 90 nm and FIG. 15b is an isometric representation of FIG. 15a scaled in the z-axis from −125 nm to +125 nm.
Figure 16:
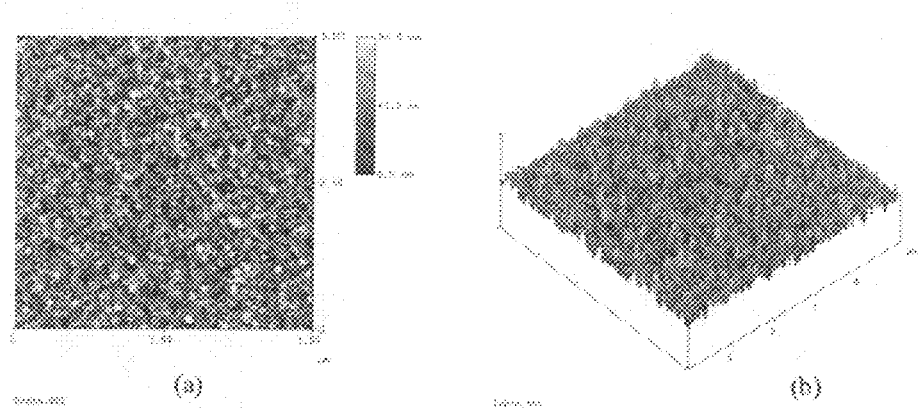
FIG. 16a shows the data from FIG. 3a rescaled from 0 to 90 nm and FIG. 16b is an isometric representation of FIG. 16a scaled in the z-axis from −125 nm to +125 nm.
Figure 17:
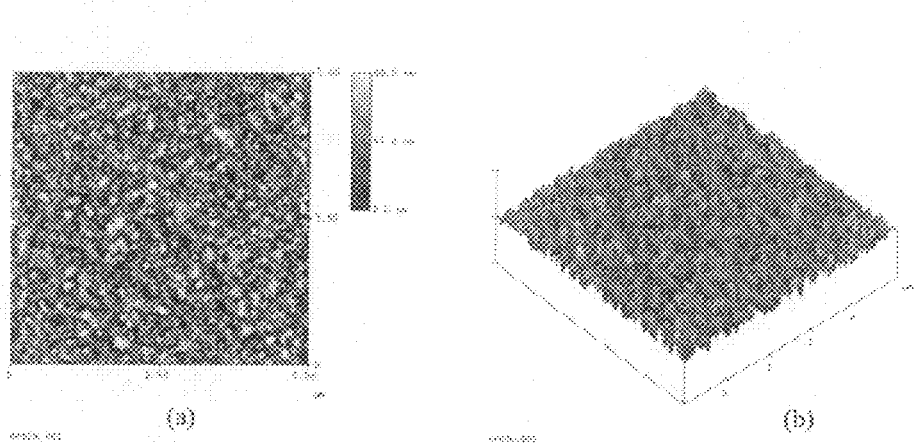
FIG. 17a shows the data from FIG. 3c rescaled from 0 to 90 nm and FIG. 17b is an isometric representation of FIG. 17a scaled in the z-axis from −125 nm to +125 nm.
Figure 18:
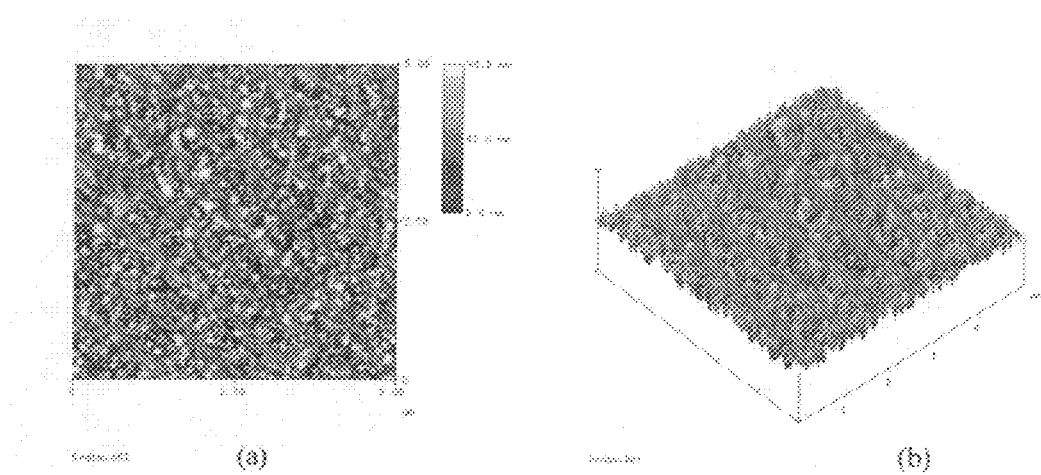
FIG. 18a shows the data from FIG. 3e rescaled from 0 to 90 nm and FIG. 18b is an isometric representation of FIG. 18a scaled in the z-axis from −125 nm to +125 nm.
Figure 19:
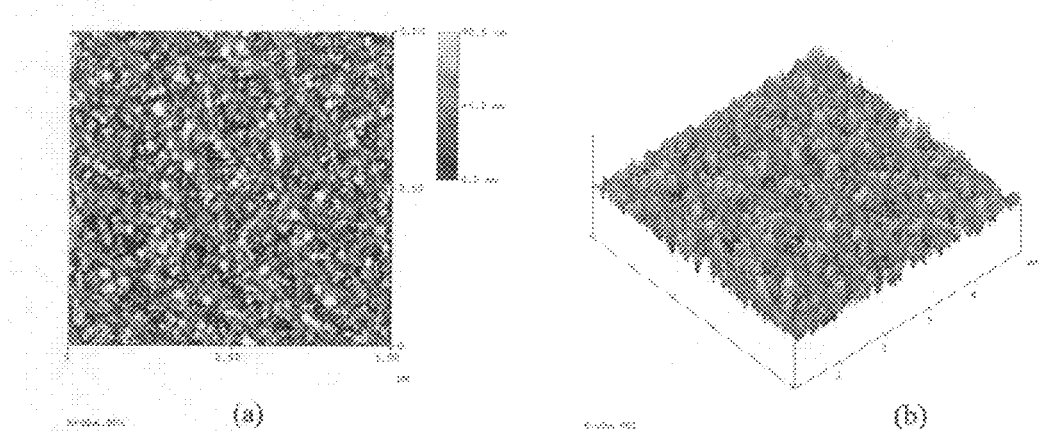
FIG. 19a shows the data from FIG. 3g rescaled from 0 to 90 nm and FIG. 19b is an isometric representation of FIG. 19a scaled in the z-axis from −125 nm to +125 nm.
Figure 20:
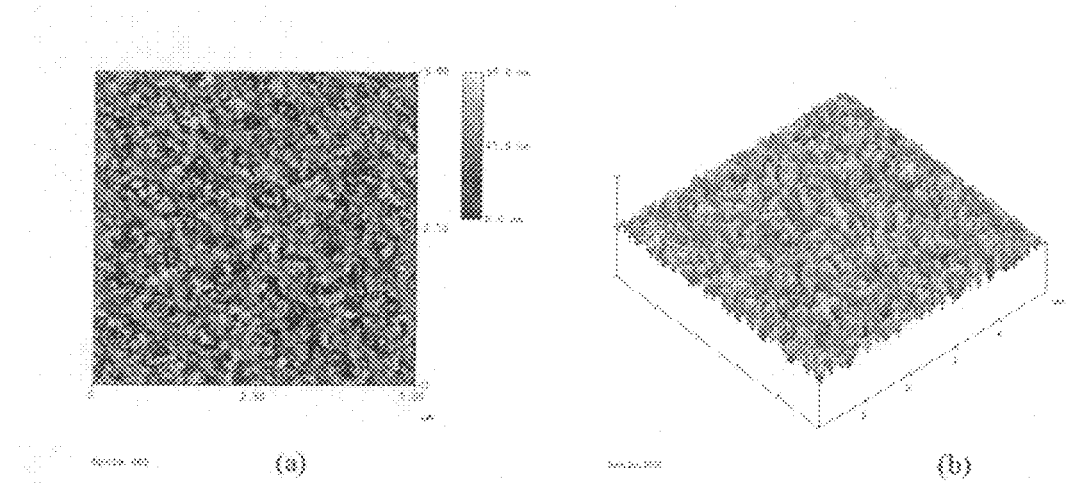
FIG. 20a shows the data from FIG. 4a rescaled from 0 to 90 nm and FIG. 20b is an isometric representation of FIG. 20a scaled in the z-axis from −125 nm to +125 nm.
Figure 21:
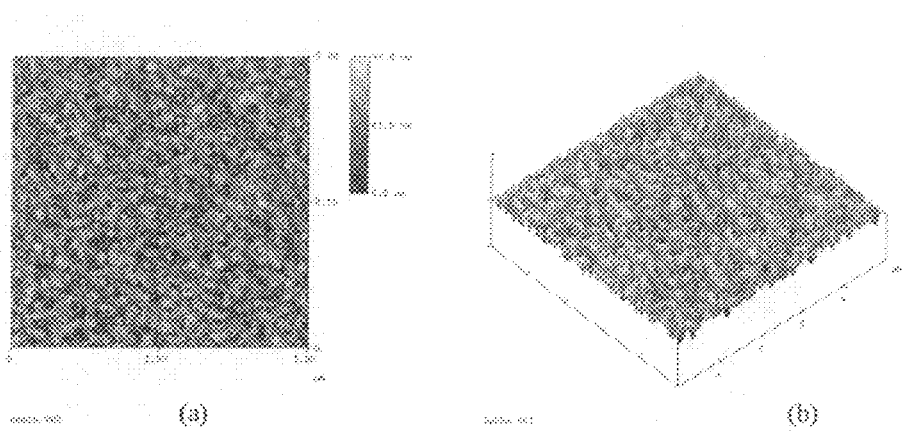
FIG. 21a shows the data from FIG. 4c rescaled from 0 to 90 nm and FIG. 21b is an isometric representation of FIG. 21a scaled in the z-axis from −125 nm to +125 nm.
Figure 22:
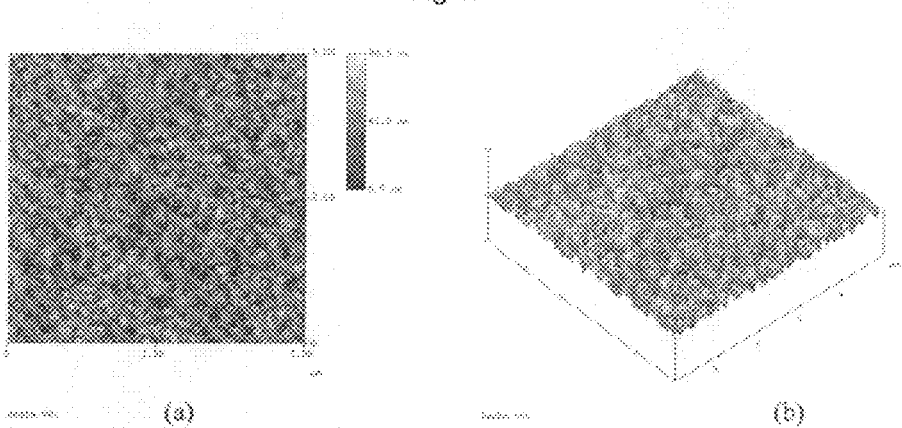
FIG. 22a shows the data from FIG. 4e rescaled from 0 to 90 nm and FIG. 22b is an isometric representation of FIG. 22a scaled in the z-axis from −125 nm to +125 nm.
Figure 23:
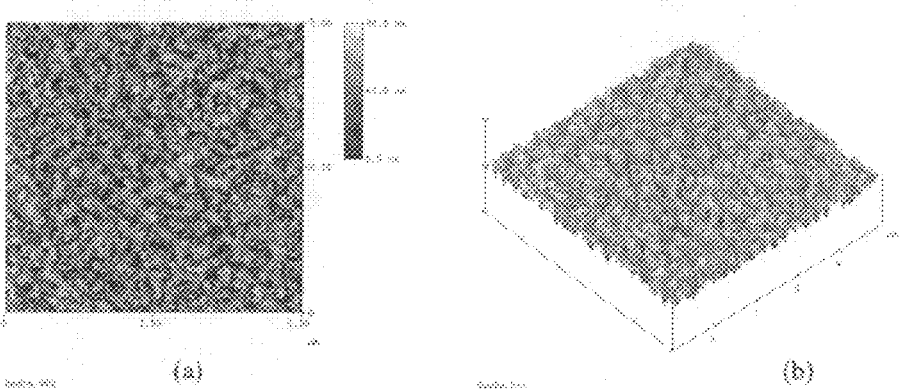
FIG. 23a shows the data from FIG. 4g rescaled from 0 to 90 nm and FIG. 23b is an isometric representation of FIG. 23a scaled in the z-axis from −125 nm to +125 nm.

To better identify the effect of polishing, the same data used to construct FIGS. 1-4 was rescaled and is presented in FIGS. 8-23. In each of the FIGS. 8-23, (a) is the same view as in the left hand figure in the corresponding FIG. 1-4. In each of the FIGS. 8-23, (b) is an isometric view of the data in the respective (a) figure. In the FIGS. 8-23 (b), the z-axis is +125 nm. The area of each square is 5×5 μm. Only FIG. 8(b) has the values of the z-axis thereon.

In FIGS. 8-23 (a), any feature greater in height than 90 nm is shown in white.

As any of the FIG. 8, 9, 10 or 11 shows, the surface of the unpolished coating in a 5 μm×5 μm square is rough and consists of a number of small granular-like features contributing the overall roughness, together with a smaller number of larger spikes greater than 90 nm.

FIGS. 12-15 show that after polishing the coating for 2 minutes with a soft brush and the slurry, the coating has become less rough. It is evident the spikes above 90 nm have been reduced to almost zero. In addition, the overall roughness has been reduced.

FIGS. 16-19 are essentially the same as FIGS. 8-11, showing the unpolished coating.

FIGS. 20-23 show the coating surface after being polished for 6 minutes with the hard brush. These figures illustrate that the spikes above 90 nm have been essentially reduced to zero. However the underlying smaller granular features are still present and have been relatively unaffected by the polishing step. By keeping a rough coating the benefits of being able to scatter light passing through the coating is maintained. In contrast, light passing through a smoother coating scatters less i.e. for a perfectly flat coating, the scattering is zero.

The invention provides a means of reducing the number of coating spikes, which can cause shunts, whilst retaining a coating that is rough to help scatter light. The spikes, which are inherent to the coating material, and which are formed when the coating is deposited have the same, or substantially the same, composition as the coating. A spike has the potential to create a shunt when a first coating to be subsequently deposited directly on top of the conductive coating is going to be similar in thickness to the height of the spikes.

AFM Conclusion

The analysis has shown that polishing the fluorine doped tin oxide coating with the soft brush with alumina, has removed much of the coating surface, leaving a surface that is dominated by pits and valleys. This is reflected by large differences in surface roughness, with only parameters related to valleys being similar in value.

Polishing the coating with a stiff brush and only water has resulted in removing the sharp edges from both the high points, and the smaller sharp point on particles within the valleys. This is reflected by the similar Sa roughness value, and the parameters associated with valley depth.

Height distribution plots have provided an indication of the changes that have occurred to the coating surface, in particular providing a clear view of the removal of the high points on the coating.

TABLE 2

Roughness Analysis of 2 Min Polished and Corresponding Reference Specimens

|  | Sa | Sq | Sdr | St | Ssk | Sz (10 pt mean) | peak count | Sp | Spm | Sv | Svm |
|---|---|---|---|---|---|---|---|---|---|---|---|
| Sample 1 | 5.490 | 6.955 | 2.616 | 69.487 | −0.619 | 53.954 | 306 | 26.489 | 4.572 | 42.999 | 4.326 |
| Sample 2 | 6.812 | 8.522 | 4.168 | 75.866 | −0.558 | 63.354 | 354 | 30.914 | 6.184 | 44.952 | 5.562 |
| Sample 3 | 6.739 | 8.421 | 3.979 | 60.149 | −0.543 | 52.856 | 336 | 21.118 | 6.098 | 39.031 | 4.347 |
| Sample 4 | 5.024 | 6.403 | 2.290 | 64.361 | −0.780 | 47.149 | 288 | 21.209 | 3.926 | 43.151 | 2.593 |
| Average | 6.016 | 7.575 | 3.263 | 67.466 | −0.625 | 54.328 | 321 | 24.933 | 5.195 | 42.533 | 4.207 |
| Std Dev | 0.898 | 1.060 | 0.948 | 6.778 | 0.108 | 6.716 | 29.597 | 4.712 | 1.124 | 2.498 | 1.221 |
| Sample 5 | 14.929 | 18.510 | 26.356 | 136.500 | 0.205 | 116.000 | 713 | 71.196 | 18.933 | 65.307 | 5.121 |
| Sample 6 | 14.919 | 18.605 | 24.332 | 129.820 | 0.228 | 104.280 | 659 | 66.375 | 19.206 | 63.445 | 4.241 |
| Sample 7 | 14.960 | 18.440 | 25.670 | 140.500 | 0.108 | 115.720 | 625 | 76.656 | 19.351 | 63.839 | 5.073 |
| Sample 8 | 15.216 | 18.575 | 23.634 | 128.050 | 0.069 | 103.360 | 616 | 63.506 | 17.001 | 64.544 | 5.095 |
| Average | 15.006 | 18.533 | 24.998 | 133.718 | 0.153 | 109.840 | 653.250 | 69.433 | 18.623 | 64.284 | 4.883 |
| Std Dev | 0.141 | 0.073 | 1.238 | 5.804 | 0.076 | 6.962 | 43.927 | 5.767 | 1.095 | 0.820 | 0.428 |

TABLE 3

Roughness Analysis of 6 Min Polished and Corresponding Reference Specimens

|  | Sa | Sq | Sdr | St | Ssk | Sz (10 pt mean) | peak count | Sp | Spm | Sv | Svm |
|---|---|---|---|---|---|---|---|---|---|---|---|
| Sample 9 | 12.801 | 15.469 | 17.859 | 96.190 | −0.232 | 75.598 | 563 | 38.055 | 14.126 | 58.135 | 5.146 |
| Sample 10 | 10.983 | 13.328 | 11.859 | 87.004 | −0.097 | 63.445 | 599 | 35.278 | 13.022 | 51.727 | 3.074 |
| Sample 11 | 10.292 | 12.671 | 10.171 | 88.256 | −0.139 | 73.119 | 493 | 34.545 | 12.686 | 53.710 | 3.820 |
| Sample 12 | 12.783 | 15.427 | 17.837 | 105.680 | −0.321 | 85.356 | 557 | 40.557 | 13.223 | 65.124 | 5.607 |
| Average | 11.715 | 14.224 | 14.432 | 94.283 | −0.197 | 74.380 | 553.000 | 37.109 | 13.264 | 57.174 | 4.412 |
| Std Dev | 1.276 | 1.439 | 4.005 | 8.619 | 0.100 | 9.002 | 44.091 | 2.751 | 0.616 | 5.938 | 1.170 |
| Sample 13 | 13.849 | 17.152 | 23.584 | 122.280 | 0.389 | 122.280 | 744 | 99.791 | 19.158 | 50.964 | 4.411 |
| Sample 14 | 14.364 | 17.820 | 23.761 | 134.700 | 0.182 | 113.250 | 697 | 75.072 | 19.180 | 59.630 | 5.984 |
| Sample 15 | 14.308 | 17.756 | 24.541 | 128.810 | 0.117 | 105.410 | 694 | 65.215 | 14.478 | 63.598 | 4.192 |
| Sample 16 | 14.702 | 18.373 | 22.749 | 129.820 | 0.206 | 114.410 | 618 | 67.443 | 19.694 | 62.377 | 5.289 |
| Average | 14.306 | 17.775 | 23.659 | 128.903 | 0.224 | 113.838 | 688.250 | 76.880 | 18.128 | 59.142 | 4.969 |
| Std Dev | 0.351 | 0.499 | 0.735 | 5.109 | 0.117 | 6.903 | 52.130 | 15.846 | 2.446 | 5.699 | 0.826 |

AFM Appendix: Interpretation of Roughness Parameters

The amplitude properties are described by five parameters, which give information about the statistical average properties, the shape of the height distribution histogram and about extreme properties. All the parameters are based on two-dimensional standards that are extended to three dimensions. Sa, Sq, Ssk, S10z, Sv, Sp and Sdr are discussed below. The parameters are well known to a person skilled in the art, for example being described in ISO/DIS 25178-2 (2007).
The Roughness Average, Sa.
The Root Mean Square (RMS) parameter, Sq.
The Surface Skewness, Ssk, which describes the asymmetry of the height-distribution histogram.
The Ten Point Height, S10z, defined as the average height of the five highest local maximums plus the average height of the five lowest local minimums.
The Surfaces Area Ratio, Sdr.
Sp is the maximum peak height, Sv is the maximum peak valley and St is the sum of Sv and Sp. Averaging these values at a number of positions within the data provides the average parameters; Spm, Svm and Stm.

The invention claimed is:
1. A process of producing an optoelectronic device, the process comprising the steps of:
   a) providing a glass substrate;
   b) applying on at least one surface of the glass substrate a transparent conductive oxide, the transparent conductive oxide forming a coating having an exposed surface with an initial roughness and at least one or more spikes inherent to the exposed surface of the transparent conductive oxide coating;
   c) polishing the exposed surface of the transparent conductive oxide coating using at least one brush to reduce the height of the at least one or more spikes inherent to the exposed surface of the transparent conductive oxide coating to produce a polished transparent conductive oxide coating with a final roughness;
   d) following step c), applying a functional component to the polished surface of the transparent conductive oxide coating.

2. The process as claimed in claim 1, wherein the initial roughness and the final roughness are substantially the same.

3. The process as claimed in claim 1, wherein the final roughness is less than the initial roughness by between 5% and 40%.

4. The process as claimed in claim 1, wherein the final roughness is 40% lower than the initial roughness.

5. The process as claimed in claim 4, wherein the final roughness is 30%-40% lower than the initial roughness.

6. The process as claimed in claim 5, wherein the final roughness is 20%-30% lower than the initial roughness.

7. The process as claimed in claim 6, wherein the final roughness is 10%-20% lower than the initial roughness.

8. The process as claimed in claim 7, wherein the final roughness is 5%-10% lower than the initial roughness.

9. The process as claimed in claim 1, wherein the optoelectronic device comprises a photovoltaic cell.

10. The process as claimed in claim 1, wherein the functional component is a component of a photovoltaic device.

11. The process as claimed in claim 1, wherein the optoelectronic device is a light emitting diode device.

12. The process as claimed in claim 1, wherein the functional component comprises a material for use in light emitting diodes.

13. The process as claimed in claim 1, wherein the polishing step uses a liquid polishing medium.

14. The process as claimed in claim 13, wherein the liquid polishing medium is an aqueous polishing medium.

15. The process as claimed in claim 13, wherein the liquid polishing medium further comprises an abrasive.

16. The process as claimed in claim 15, wherein the abrasive comprises a metal oxide abrasive.

17. The process as claimed in claim 1, wherein the polishing step uses a rotary brush.

18. The process as claimed in claim 17, wherein the rotary brush, during polishing, has an axis of rotation transverse to the surface of the substrate.

19. The process according to claim 18, wherein the rotary brush has a rotational speed relative to the substrate of less than 1000 rpm.

20. The process according to claim 19, wherein the rotational speed relative to the substrate is between 50 and 500 rpm.

21. The process according to claim 20, wherein the rotational speed relative to the substrate is between 100 and 300 rpm.

22. The process as claimed in claim 17, wherein the bristles of the brush comprise a synthetic material.

23. The process as claimed in claim 22, wherein the bristles of the brush are nylon or polyester.

24. The process as claimed in claim 22, wherein the diameter of the bristles of the brush are in the range 0.1 to 1.0 mm.

25. The process as claimed in claim 22, wherein the length of the bristles of the brush are in the range 5 to 50 mm.

26. The process as claimed in claim 22, wherein one or more of the bristles of the brush comprise an abrasive material.

27. The process as claimed in claim 1, wherein the conductive coating on the substrate is a conductive metal oxide.

28. The process as claimed in claim 27, wherein the conductive metal oxide comprises tin oxide.

29. The process as claimed in claim 28, wherein the tin oxide is fluorine doped tin oxide.

30. The process as claimed in claim 1, wherein the conductive coating on the substrate is deposited by a chemical vapour deposition step.

31. A process of removing spikes from a layer of transparent conductive oxide in the production of an optoelectronic device, the process comprising the steps of:
   a) providing a glass substrate;
   b) applying on at least one surface of the glass substrate a transparent conductive oxide coating, the transparent conductive oxide forming a coating having an exposed surface with an initial roughness and at least one or more spikes inherent to the exposed surface of the transparent conductive oxide coating;
   c) polishing the exposed surface of the transparent conductive oxide coating using at least one brush to reduce the height of the at least one or more spikes inherent to the exposed surface of the conductive coating to give the transparent conductive coating a final roughness;
   d) after step c) applying a functional component to the transparent conductive oxide coating on the surface of the substrate.

32. The process as claimed in claim 31, wherein the conductive coating on the substrate is a conductive metal oxide.

33. The process as claimed in claim 31, wherein the conductive metal oxide comprises tin oxide.

34. The process as claimed in claim 31, wherein the tin oxide is fluorine doped tin oxide.

35. The process as claimed in claim 31, wherein the conductive coating on the substrate is deposited by a chemical vapour deposition step.

\* \* \* \* \*